(12) United States Patent
Maurer et al.

(10) Patent No.: US 12,188,797 B2
(45) Date of Patent: Jan. 7, 2025

(54) SPRAY FLOW SENSING WITH MAGNETIC CARRIER

(71) Applicant: Intelligent Agricultural Solutions LLC, Fargo, ND (US)

(72) Inventors: Garrett Maurer, Moorhead, MN (US); Justin Jee, Fargo, ND (US); Dan Bjertness, Fargo, ND (US); Ross Eickhoff, Fargo, ND (US)

(73) Assignee: Intelligent Agricultural Solutions, LLC, Fargo, ND (US)

( * ) Notice: Subject to any disclaimer, the term of this patent is extended or adjusted under 35 U.S.C. 154(b) by 272 days.

(21) Appl. No.: 17/813,513

(22) Filed: Jul. 19, 2022

(65) Prior Publication Data

US 2023/0023497 A1 Jan. 26, 2023

Related U.S. Application Data

(60) Provisional application No. 63/224,119, filed on Jul. 21, 2021, provisional application No. 63/224,206, filed on Jul. 21, 2021.

(51) Int. Cl.
*G01F 1/115* (2006.01)
*G01R 33/07* (2006.01)
*A01M 7/00* (2006.01)

(52) U.S. Cl.
CPC .......... *G01F 1/1155* (2013.01); *G01R 33/072* (2013.01); *A01M 7/0042* (2013.01)

(58) Field of Classification Search
CPC ... G01R 33/072; A01M 7/0042; G01F 1/1155
USPC ........................................................ 73/861
See application file for complete search history.

(56) References Cited

U.S. PATENT DOCUMENTS

| | | | |
|---|---|---|---|
| 3,934,473 A | 1/1976 | Griffo | |
| 5,388,466 A * | 2/1995 | Teunissen | G01P 5/07 73/861.77 |
| 6,874,372 B2 * | 4/2005 | Bindocci | G01F 1/80 73/861.352 |
| 10,827,740 B2 | 11/2020 | Wonderlich et al. | |
| 2004/0255693 A1 * | 12/2004 | Bindocci | G01F 1/80 73/861.352 |

(Continued)

FOREIGN PATENT DOCUMENTS

| | | | | |
|---|---|---|---|---|
| CN | 213748594 U | * | 7/2021 | ........... G01F 15/007 |
| WO | 2016035037 A1 | | 3/2016 | |
| WO | 2021067739 A2 | | 4/2021 | |

OTHER PUBLICATIONS

Translation of CN-213748594-U (Year: 2021).*

(Continued)

*Primary Examiner* — Nathaniel T Woodward (57) ABSTRACT

A flow rate sensor system for an agricultural sprayer includes a drum housing and a central passage housing defining a flow path, a Hall-effect sensor, a Hall-effect sensor window in a display housing, a magnetic carrier within the drum housing, and a magnet positioned in the magnetic carrier. The flow path has a first portion generally parallel to an axis, and a second vortex portion around the axis. The Hall-effect sensor faces the axis. The Hall-effect sensor window is between the Hall-effect sensor and the axis. The magnetic carrier is configured to rotate about the axis. Related methods are also disclosed.

12 Claims, 10 Drawing Sheets

(56) References Cited

U.S. PATENT DOCUMENTS

2005/0097969 A1* 5/2005 Gadini ................ G01F 15/006
                                                      73/861.33
2010/0185394 A1   7/2010  Wu et al.
2020/0196520 A1   6/2020  Schoeny et al.
2020/0355527 A1  11/2020  Scilingo

OTHER PUBLICATIONS

European Patent Office, International Search Report related to International Patent Application No. PCT/IB2022/054761, mail date Aug. 23, 2022.

* cited by examiner

FIG. 10

SPRAY FLOW SENSING WITH MAGNETIC CARRIER

CROSS-REFERENCE TO RELATED APPLICATIONS

This application claims the benefit of the filing date of U.S. Provisional Patent Application 63/224,206, "Spray Flow Sensing with Magnetic Carrier," and U.S. Provisional Patent Application 63/224,119, "Spray Monitoring System," each filed Jul. 21, 2021, the entire disclosure of each of which is incorporated herein by reference.

TECHNICAL FIELD

The present disclosure relates generally to agricultural sprayers, and more specifically to a magnetic sensor system for measuring the flow rate of an agricultural sprayer.

BACKGROUND

It is desirable to measure the flow rate of an agricultural sprayer to monitor the amount of fluid, such as a pesticide, being sprayed in a particular area and ensure spray nozzle integrity. Overuse of pesticides can lead to product waste and adverse environmental outcomes, while underuse of pesticides can cause an area to be inadequately treated and in some instances can contribute to increasing pesticide resistance.

BRIEF SUMMARY

In some embodiments, a flow rate sensor system for an agricultural sprayer includes a drum housing and a central passage housing defining a first flow path, a Hall-effect sensor, a Hall-effect sensor window, a magnetic carrier, and a magnet positioned in the magnetic carrier. The fluid flow path comprises a first portion generally parallel to an axis and a second vortex portion around the axis. The Hall-effect sensor is disposed facing the axis. The Hall-effect sensor window is in a display housing and is disposed between the Hall-effect sensor and the axis. The magnetic carrier is within the drum housing, and is configured to rotate about the axis when fluid flows through the first flow path.

In some embodiments, a method of operating a flow rate sensor system for an agricultural sprayer includes directing, with a drum housing and a central passage housing, a fluid along a vortex flow path within the drum housing and around an axis. A source of a Hall-effect sensor generates a current through a conductor of the Hall-effect sensor. A detector of the Hall-effect sensor detects when at least one target passes a Hall-effect sensor window. The at least one target comprises a magnet within the drum housing and in the vortex flow path of the fluid. A controller of the Hall-effect sensor generates magnetic field data about the at least one target. The controller assesses a speed of the at least one target about the axis to calculate a flow rate of the fluid along the vortex flow path.

The present summary is provided only by way of example, and not limitation. Other aspects of the present disclosure will be appreciated in view of the entirety of the present disclosure, including the entire text, claims, and accompanying figures.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments may include features and components not specifically shown in the drawings.

DETAILED DESCRIPTION

A flow rate sensor for a sprayer uses a magnetic carrier in combination with vortexing geometry to measure the flow rate of a fluid through the sprayer. The use of a Hall-effect sensor avoids problems associated with optical sensors, allowing for accurate readings across a wide range of fluid opacity. The vortexing geometry is provided by the shape of a section of the sensor upstream of the magnetic carrier, and creates a vortex flow, which allows for accurate readings across a wide range of fluid flow rates.

Figure 1A:
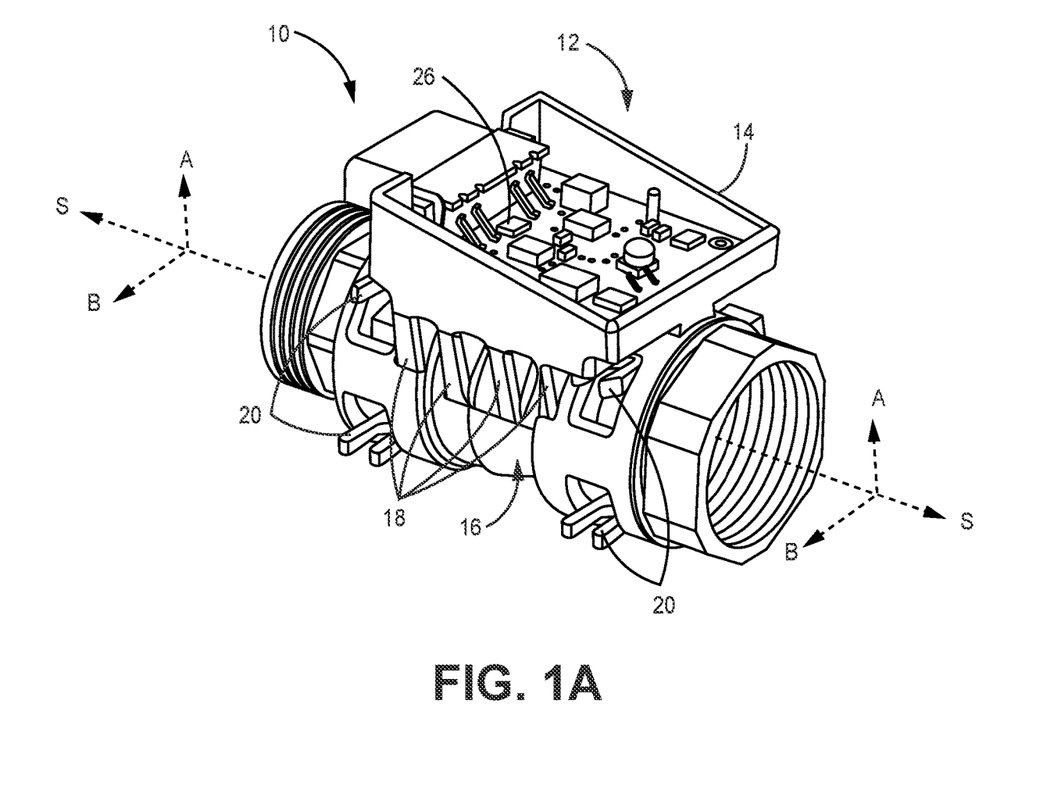
FIG. 1A is a front perspective view of a flow rate sensor system.
Figure 1B:
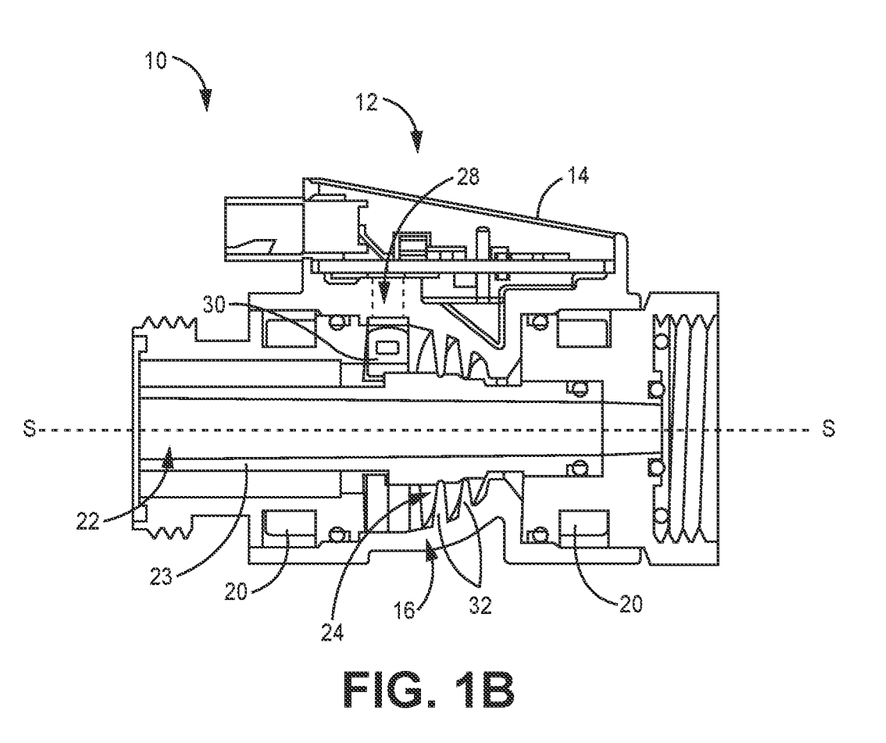
FIG. 1B is a cross-sectional view of the system of FIG. 1A along a central plane.
Figure 2:
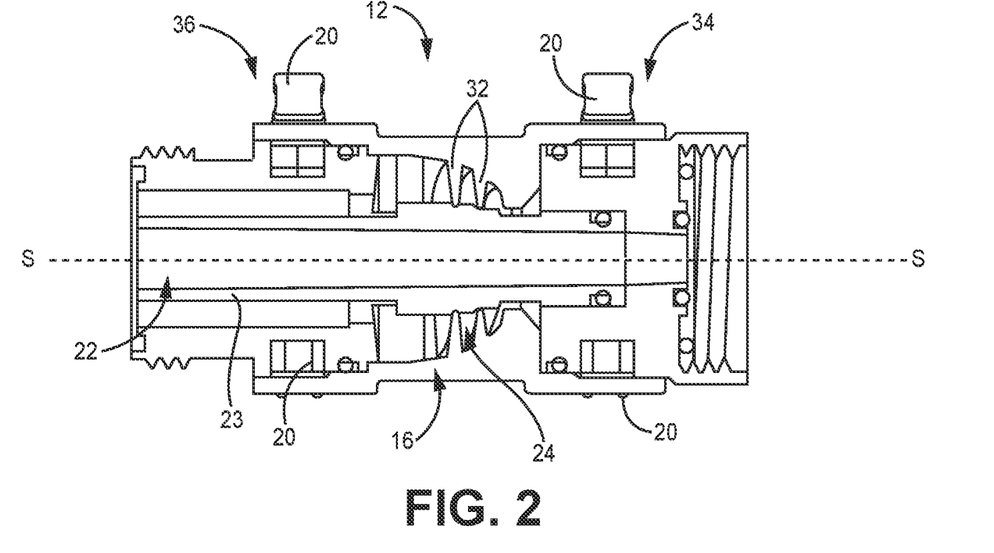
FIG. 2 is a cross-sectional view of the system of FIG. 1A taken orthogonal to the cross-sectional view of FIG. 1B.

FIG. 1A is a perspective view of a flow rate sensor system 10 for an agricultural sprayer, including a Hall-effect sensor 26. FIG. 1B is a cross-sectional view of sensor system 10 taken along plane A-A. FIG. 2 is a cross-sectional view of a flow rate sensor section 12 of FIG. 1A taken along plane B-B, which is orthogonal to plane A-A. Sensor system 10 includes flow rate sensor section 12, display housing 14, drum housing 16, splines 18, clips 20, and central passage housing 23. Flow rate sensor section 12 includes Hall-effect sensor 26, Hall-effect sensor window 28, and magnetic carrier 30 (shown in FIGS. 3A-3B). Drum housing 16 includes interior walls 32 defining a vortex flow path 24. Sensor system 10 is oriented along an axis S-S, which is in plane A-A. Sensor system 10 includes a first end 34 and a second end 36.

Flow rate sensor section 12 is oriented axially along spray axis S-S and can be located adjacent to a housing section that contains components for routing fluid towards a spray nozzle. Flow rate sensor section 12 includes components of sensor system 10 to enable measurement of the flow rate of a fluid within sensor system 10, such as Hall-effect sensor 26. Drum housing 16 extends axially along axis S-S and defines an approximately hemispheric interior shape. Drum housing 16 defines a cavity therein that defines the vortex flow path 24. Interior walls 32 extend from inner surface 33 of drum housing 16 (shown in FIG. 3A), and interior walls 32 can extend both circumferentially around inner surface 33 and axially along drum housing 16 with respect to axis S-S. In the example depicted in FIGS. 1A-2, interior walls 32 form a vortexing geometry within drum housing 16.

Display housing 14 can be mounted to drum housing 16 such that display housing 14 is adjacent to drum housing 16 and central passage housing 23 during operation of sensor system 10. Display housing 14 is configured to receive a display, such as a screen, which can communicate information about the operation of sensor system 10 to a user. This information can include flow rate of a fluid within sensor system 10. Hall-effect sensor 26 can be located adjacent to a bottom side of display housing 14 with respect to the drum housing 16. Hall-effect sensor window 28 can be an opening that extends through display housing 14 and drum housing 16. As described in more detail below, Hall-effect sensor 26 can be located adjacent to Hall-effect sensor window 28 such that Hall-effect sensor 26 can detect the movement of magnetic carrier 30 within drum housing 16. Magnetic carrier 30 serves as a Hall-effect encoder wheel for Hall-effect sensor 26, with rotation driven by the flow of fluid through sensor system 10.

Splines 18 extend from display housing 14 to support and stabilize display housing 14 above drum housing 16. Clips 20 secure drum housing 16 about central passage 22 such that drum housing 16 is connected to central passage housing 23. Central passage 22 extends axially within sensor system 10 with respect to axis S-S.

As described in more detail below, fluid flows through drum housing 16 along the vortex flow path 24 defined by interior walls 32 such that the fluid is directed to travel in the vortex path 24 around the central passage 22. The fluid then is directed into central passage 22 and flows in the opposite direction to eventually be routed out of the sensor system (e.g., to a spray nozzle). As described in more detail below, Hall-effect sensor 26 can include components such as a source, a detector, a conductor, and a controller, and Hall-effect sensor 26 is configured to detect and analyze the movement of a target such as magnetic carrier 30 about spray axis S-S within drum housing 16.

During operation of sensor system 10, fluid flows through flow rate sensor section 12. Fluid enters first end 34 of drum housing 16 and flows in a direction parallel to axis S-S (i.e., along the first flow path). The fluid then is directed in the vortex flow path 24 by interior walls 32. This vortex flow path 24 is characterized by having both an axial component (towards second end 36 of drum housing 16) and a circumferential component (about inner circumference 38 of drum housing 16, shown in FIG. 3A). The interior geometry of drum housing 16 (i.e., interior walls 32) and the exterior of central passage housing 23 together define the vortex flow path 24. As a consequence of the vortexing geometry of interior walls 32, fluid contacts magnetic carrier 30 at a vector velocity with a substantial circumferential component, improving responsiveness (i.e., rotation) of magnetic carrier 30 at high and low fluid flow rates. The fluid arrives at second end 36, flows into central passage 22, and flows through central passage 22 towards first end 34. The fluid can then be routed to an outlet of sensor system 10, such as a spray nozzle. The movement of fluid through flow rate sensor section 12 drives the rotation of magnetic carrier 30 about axis S-S.

Figure 3A:
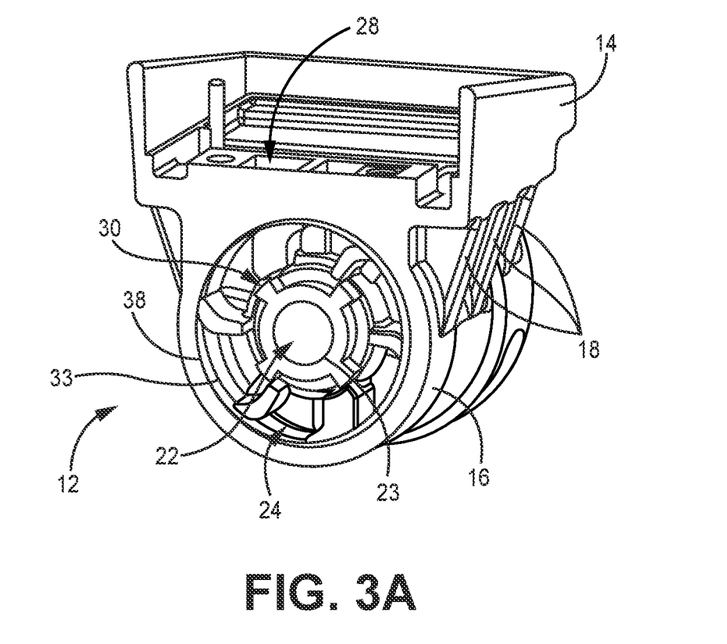
FIG. 3A is a cross-sectional perspective view of a magnetic carrier within the flow rate sensor system of FIG. 1A, taken orthogonally with respect to an axis of the sensor system.
Figure 3B:
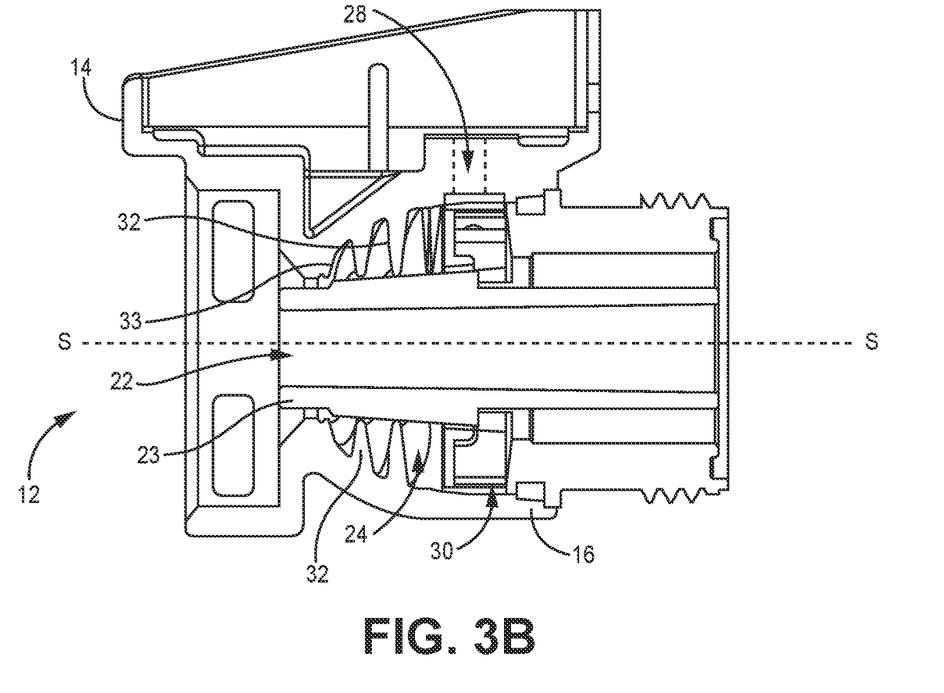
FIG. 3B is a cross-sectional view of the flow rate sensor system of FIG. 3A, taken along the axis.
Figure 4A:
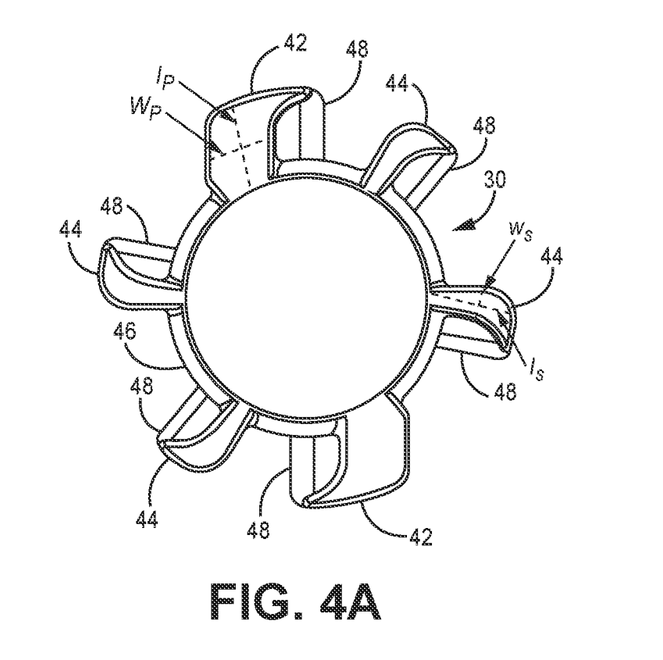
FIG. 4A is a front perspective view of a magnetic carrier having six fins and webbing sections.
Figure 4B:
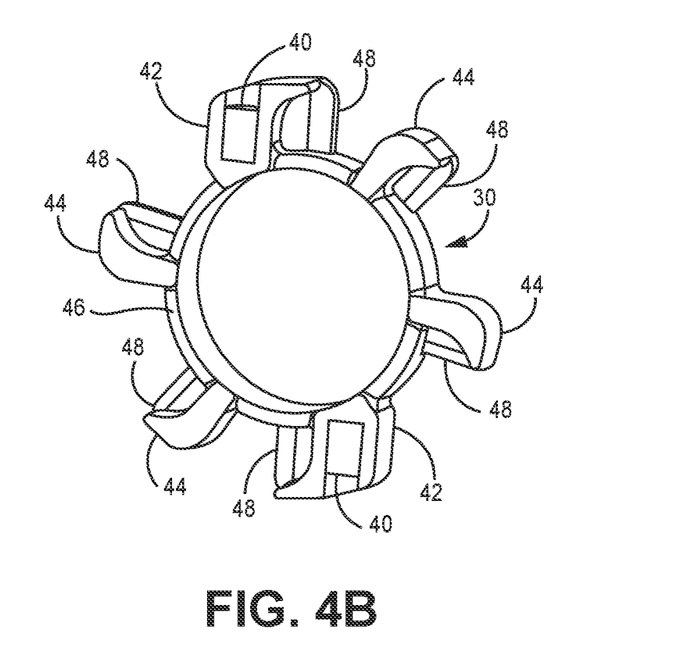
FIG. 4B is a cross-sectional view of the magnetic carrier of FIG. 4A, taken orthogonally with respect to a rotational axis of the magnetic carrier.

FIG. 3A is a cross-sectional view of sensor system 10, taken orthogonally with respect to spray axis S-S. FIG. 3B is a cross-sectional view of the sensor system 10 taken along plane A-A. FIG. 4A is a front perspective view of magnetic carrier 30. FIG. 4B is a cross-sectional view of magnetic carrier 30, taken orthogonally with respect to a rotational axis of magnetic carrier 30.

Magnetic carrier 30 is configured to rotate about a rotational axis of magnetic carrier 30. When magnetic carrier 30 is operating within flow rate sensor section 12, the rotational axis of magnetic carrier 30 can be aligned with axis S-S of sensor system 10 such that axis S-S is oriented in approximately the center of central ring 46.

Primary fins 42 and secondary fins 44 are arranged circumferentially and evenly spaced along central ring 46. Primary fins 42 and secondary fins 44 extend radially outward from central ring 46 with respect to the rotational axis of magnetic carrier 30. Radial length $I_p$ of primary fins 42 can be greater than radial length $I_s$ of secondary fins 44, such that each primary fin 42 extends a farther radial distance from central ring 46 than each secondary fin 44. Width $w_p$ of each primary fin 42 can be greater than width $w_s$ of each secondary fin 44. In the embodiment shown in FIGS. 4A-4B, magnetic carrier 30 includes two primary fins 42 and four secondary fins 44, for a total of six fins. Primary fins 42 are each configured to receive one magnet 40. Each webbing section 48 can be located adjacent to a primary fin 42 or secondary fin 44. Each webbing section 48 can have a radial length equivalent to radial lengths $I_p$ or $I_s$. For example, a webbing section 48 located adjacent to a primary fin 42 can have a radial length $I_p$ (i.e., the same radial length as the primary fin 42). As described in more detail below, the number, size, and orientation of primary fins 42 and secondary fins 44, as well as the size and orientation of webbing sections 48, can be varied to achieve corresponding variations of the movement of magnetic carrier 30 (such as consistent rotation at lower flow rates).

Primary fins 42 and secondary fins 44 are shaped to facilitate the rotation of magnetic carrier 30 about spray axis S-S. As fluid flows into drum housing 16, it travels along the vortex flow path 24. The combined circumferential and axial direction of fluid flow drives the rotation of magnetic carrier 30 about axis S-S. Primary fins 42 and secondary fins 44 come in contact with the fluid and are rotated about axis S-S by the movement of the fluid along the vortex flow path 24. Webbing sections 48 can further facilitate the rotation of magnetic carrier 30 by providing more surface area for the fluid to contact primary fins 42 and/or secondary fins 44, and by forming a bucket that retains fluid in impingement against each of primary fins 42 and secondary fins 44.

Figure 5:
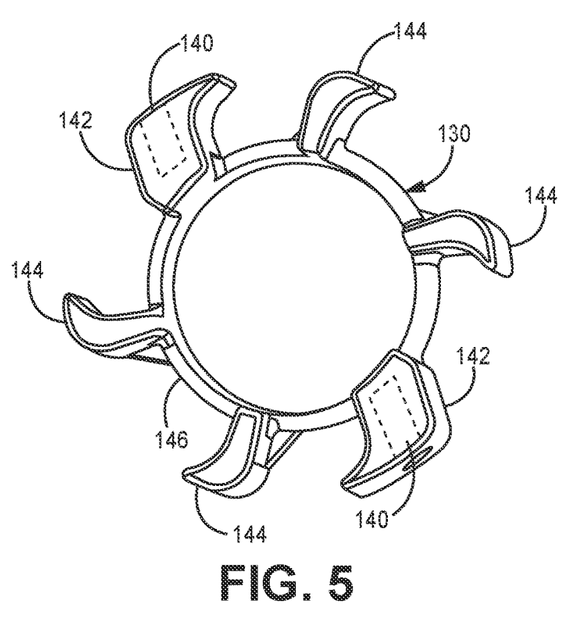
FIG. 5 is a front perspective view of another magnetic carrier having six fins.

FIG. 5 is a front perspective view of magnetic carrier 130. Magnetic carrier 130 includes magnets 140, primary fins 142, secondary fins 144, and central ring 146. As described above in reference to FIGS. 4A-4B, magnetic carrier 130 can operate within a sensor system 10, and magnetic carrier 130 is configured to rotate about a rotational axis aligned with axis S-S of sensor system 10.

Primary fins 142 and secondary fins 144 are arranged circumferentially along central ring 146. As described above in reference to FIGS. 4A-4B, primary fins 142 and secondary fins 144 extend radially outward from central ring 146 with respect to the rotational axis of magnetic carrier 130, radial length $I_p$ of each primary fin 142 can be greater than radial length $I_s$ of each secondary fin 144, and width $w_p$ of each primary fin 142 can be greater than width $w_s$ of each secondary fin 144. In the embodiment shown in FIG. 5, magnetic carrier 130 includes two primary fins 142 and four secondary fins 144, for a total of six fins. Primary fins 142 are each configured to receive magnets 140.

As described above in reference to FIGS. 4A-4B, primary fins 142 and secondary fins 144 are shaped to facilitate the rotation of magnetic carrier 130 about the rotational axis through the flow of fluid along the vortex flow path within sprayer drum 24.

Figure 6:
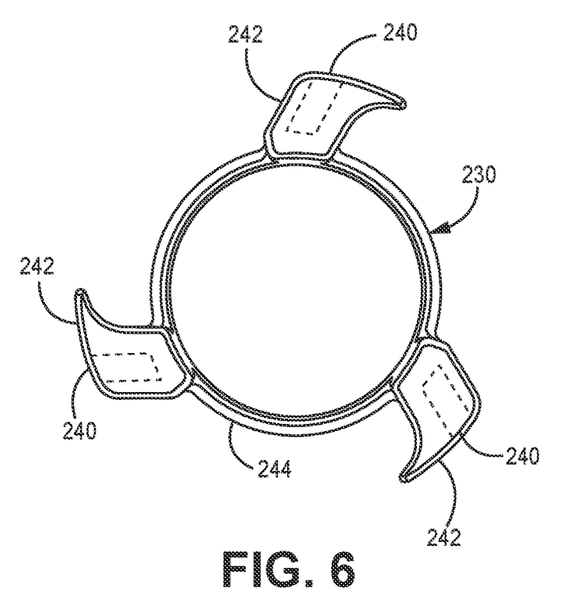
FIG. 6 is a front perspective view of a magnetic carrier having three fins.

FIG. 6 is a front perspective view of another magnetic carrier 230. Magnetic carrier 230 includes magnets 240, primary fins 242, and central ring 244. As described above in reference to FIGS. 4A-4B, magnetic carrier 230 can operate within a sensor system 10, and magnetic carrier 230 is configured to rotate about a rotational axis aligned with axis S-S of sensor system 10.

Primary fins 242 are arranged circumferentially and evenly spaced along central ring 244. Primary fins 242 extend radially outward from central ring 244 with respect to the rotational axis of magnetic carrier 230. In the embodiment shown in FIG. 6, magnetic carrier 230 includes three primary fins 242, each configured to receive magnets 240.

As described above in reference to FIGS. 4A-4B, primary fins 242 are shaped to facilitate the rotation of magnetic carrier 230 about the rotational axis through the flow of fluid along the vortex flow path within sprayer drum 24.

Figure 7:
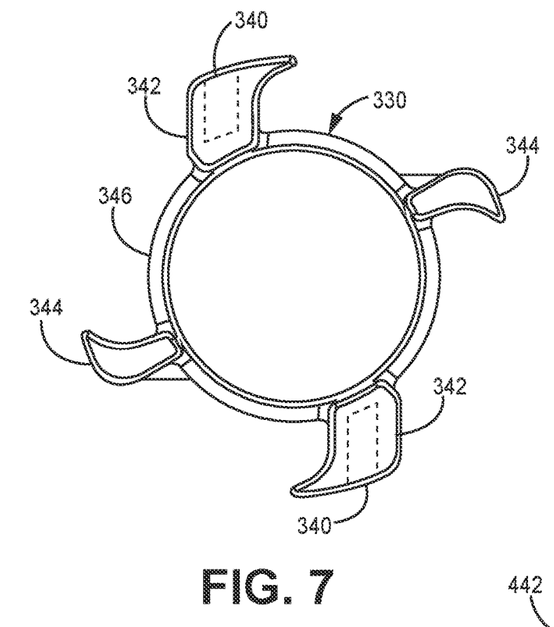
FIG. 7 is a front perspective view of a magnetic carrier having four evenly spaced fins.

FIG. 7 is a front perspective view of magnetic carrier 330. Magnetic carrier 330 includes magnets 340, primary fins 342, secondary fins 344, and central ring 346. As described above in reference to FIGS. 4A-4B, magnetic carrier 330 can operate within a sensor system 10, and magnetic carrier 330 is configured to rotate about a rotational axis aligned with axis S-S of sensor system 10.

Primary fins 342 and secondary fins 344 are arranged circumferentially and evenly spaced along central ring 346. As described above in reference to FIGS. 4A-4B, primary fins 342 and secondary fins 344 extend radially outward from central ring 346 with respect to the rotational axis of magnetic carrier 330, the radial length of each primary fin 342 can be greater than the radial length of each secondary fin 344, and the width of each primary fin 342 can be greater than the width of each secondary fin 344. In the embodiment shown in FIG. 7, magnetic carrier 330 includes two primary fins 342 and two secondary fins 344, for a total of four fins. Primary fins 342 are each configured to receive one magnet 340.

As described above in reference to FIGS. 4A-4B, primary fins 342 and secondary fins 344 are shaped to facilitate the rotation of magnetic carrier 330 about the rotational axis through the flow of fluid along the vortex flow path 24 within drum housing 16.

Figure 8:
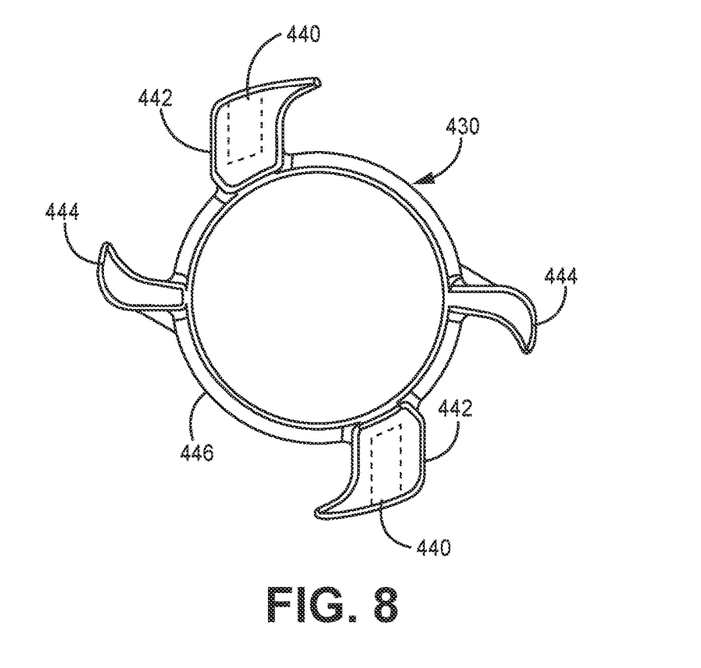
FIG. 8 is a front perspective view of another magnetic carrier having four fins.

FIG. 8 is a front perspective view of magnetic carrier 430. Magnetic carrier 430 includes magnets 440, primary fins 442, secondary fins 444, and central ring 446. As described above in reference to FIGS. 4A-4B, magnetic carrier 430 can operate within a sensor system 10, and magnetic carrier 430 is configured to rotate about a rotational axis aligned with axis S-S of sensor system 10.

Primary fins 442 and secondary fins 444 are arranged circumferentially along central ring 446. As described above in reference to FIGS. 4A-4B, primary fins 442 and secondary fins 444 extend radially outward from central ring 446 with respect to the rotational axis of magnetic carrier 430, the radial length of each primary fin 442 can be greater than the radial length of each secondary fin 444, and the width of each primary fin 442 can be greater than the width of each secondary fin 444. In the embodiment shown in FIG. 8, magnetic carrier 430 includes two primary fins 442 and two secondary fins 444, for a total of four fins. Each primary fin 442 is located closer to one secondary fin 444 than the other secondary fin 444. Primary fins 442 are each configured to receive magnets 440.

As described above in reference to FIGS. 4A-4B, primary fins 442 and secondary fins 444 are shaped to facilitate the rotation of magnetic carrier 430 about the rotational axis through the flow of fluid along the vortex flow 24 path within drum housing 16.

Figure 9:
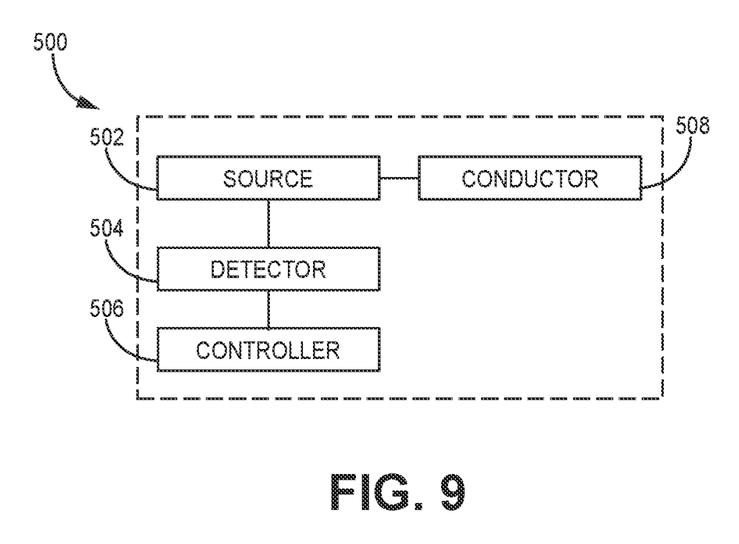
FIG. 9 is a schematic diagram of a Hall-effect sensor.
Figure 10:
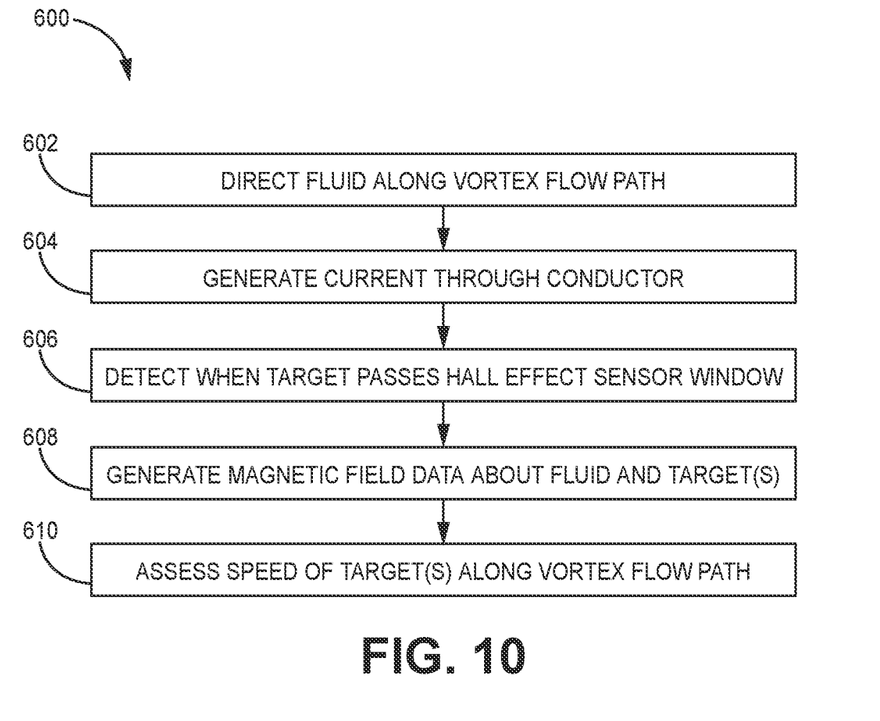
FIG. 10 illustrates a method of operating a flow rate sensor system.

FIG. 9 is a simplified schematic diagram of Hall-effect sensor 500. FIG. 10 illustrates method 600 of operating a flow rate sensor system. Hall-effect sensor 500 includes source 502, detector 504, controller 506, and conductor 508. Method 600 includes acts 602-610. Hall-effect sensor 500 can be substantially the same as Hall-effect sensor 26 described above, have the same location as Hall-effect sensor 26 within sensor system 10, and be configured to operate in substantially the same ways as Hall-effect sensor 26.

In act 602, a drum housing of a sensor system (such as drum housing 16 within sensor system 10) directs fluid along a vortex flow path 24. As described in detail above in reference to FIGS. 3A-3B, the shapes of the drum housing and central passage housing cause the fluid to travel along the vortex flow path.

In act 604, source 502 of Hall-effect sensor 500 generates an electric current through conductor 508. As described in more detail below, when a magnetized object passes through this electric current, a magnetic field is generated.

In act 606, detector 504 of Hall-effect sensor 500 detects when a target (such as magnet 40 within magnetic carrier 30) passes a Hall-effect sensor window (such as Hall-effect sensor window 28). The movement of, for example, magnet 40 past the Hall-effect sensor window generates a magnetic field which is detectable by detector 504. In this way, the rotation of magnetic carrier 30 about the axis S-S can be detected by detector 504 through the movement of magnets 40 past Hall-effect sensor 500.

In act 608, controller 506 of Hall-effect sensor 500 generates magnetic field data about the target and the fluid. This magnetic field data can, for example, be magnetic field strength data and/or data about the direction of the magnetic field.

In act 610, controller 506 assesses a speed of the target along the vortex flow path (i.e., a rotational speed). The speed of the target along the vortex flow path will typically correspond to the flow rate of the fluid along the vortex flow path. The speed of the target can be found by, for example, calculating the frequency of the target's rotation. Controller 506 can, for example, convert the target's rotational speed within the drum housing to a linear speed of the fluid and calculate the flow rate of the fluid.

Using a magnetic carrier within a flow rate sensor system for a sprayer provides several advantages. The use of a magnetic carrier allows measurement of the flow rate using a Hall-effect sensor. The configuration of the magnetic carrier allows the flow rate sensor system to be varied based on other system parameters. The number, size, and orientation of the fins and webbing sections of the magnetic carrier can be varied to achieve corresponding variations of the movement of the magnetic carrier and can enable consistent rotation at lower flow rates. The magnetic carrier facilitates accurate readings across a range of fluid opacities and flow rates. Rotation of the magnetic carrier is facilitated (especially at low and high fluid flow rates) by pre-vortexing of fluid via vortexing geometry of interior walls upstream of the magnetic carrier. This pre-vortexed flow contacts the magnetic carrier along a partially circumferential vector. The pre-vortexed flow efficiently drives the fins and enables the flow rate sensor as a whole to generate accurate measurements of flow rate, even at flow rates too low to reliably turn the magnetic carrier with unvortexed (i.e., purely axial) fluid flow. Finally, a magnetic carrier made of inexpensive materials is a cost-effective method of increasing ease of use of the flow rate sensor system.

The following are non-exclusive descriptions of possible embodiments.

An embodiment of a flow rate sensor system for an agricultural sprayer includes a drum housing and a central passage housing defining a first flow path, a Hall-effect sensor, a Hall-effect sensor window, a magnetic carrier, and a magnet positioned in the magnetic carrier. The fluid flow path comprises a first portion generally parallel to an axis and a second vortex portion around the axis. The Hall-effect sensor is disposed facing the axis. The Hall-effect sensor window is in a display housing and is disposed between the Hall-effect sensor and the axis. The magnetic carrier is within the drum housing, and is configured to rotate about the axis when fluid flows through the first flow path.

The central passage housing may define a second flow path generally parallel to, and in an opposite direction of, the first flow path. The drum housing and central passage housing may be configured to direct a fluid along the second vortex portion of the first flow path such that the fluid drives rotation of the magnetic carrier.

The magnetic carrier may comprise a central ring oriented about the axis, and a plurality of fins. The plurality of fins is oriented circumferentially along and extending radially outward from the central ring with respect to the axis.

The drum housing and central passage housing may be configured to direct fluid in the first flow path to impinge partially circumferentially on the plurality of fins.

At least one of the plurality of fins may contain the at least one magnet.

The magnetic carrier may further comprise a plurality of webbing sections. Each of the plurality of webbing sections is adjacent to one of the plurality of fins. The plurality of fins may be evenly spaced about the central ring.

In some embodiments, the plurality of fins comprises a plurality of primary fins and a plurality of secondary fins. Each of the plurality of primary fins has a primary length and a primary width. Each of the plurality of secondary fins has a secondary length and a secondary width. The primary length is greater than the secondary length, and the primary width is greater than the secondary width.

In some embodiments, the drum housing comprises an inner surface and an interior wall which extends from the inner surface. The interior wall extends circumferentially about a circumference of the inner surface and axially parallel to the axis such that the interior wall defines the second vortex portion of the first flow path.

An embodiment of a method of operating a flow rate sensor system for an agricultural sprayer includes directing, with a drum housing and a central passage housing, a fluid along a vortex flow path within the drum housing and around an axis. A source of a Hall-effect sensor generates a current through a conductor of the Hall-effect sensor. A detector of the Hall-effect sensor detects when at least one target passes a Hall-effect sensor window. The at least one target comprises a magnet within the drum housing and in the vortex flow path of the fluid. A controller of the Hall-effect sensor generates magnetic field data about the at least one target. The controller assesses a speed of the at least one target about the axis to calculate a flow rate of the fluid along the vortex flow path.

In some embodiments, a magnetic carrier is rotated about a spray axis of the agricultural sprayer, and the at least one target is carried by the magnetic carrier.

In a further embodiment, wherein the magnetic carrier comprises a plurality of fins. The controller of the Hall-effect sensor generates magnetic field data about each of the plurality of fins. The controller assesses a rotations speed of the magnetic carrier.

The invention claimed is:

1. A flow rate sensor system for an agricultural sprayer, the flow rate sensor system comprising:
   a drum housing and a central passage housing defining a first flow path comprising a first portion generally parallel to an axis and a second vortex portion around the axis;
   a Hall-effect sensor disposed facing the axis;
   a Hall-effect sensor window in a display housing and disposed between the Hall-effect sensor and the axis;
   a magnetic carrier within the drum housing, wherein the magnetic carrier is configured to rotate about the axis when fluid flows through the first flow path; and
   at least one magnet positioned in the magnetic carrier,
   wherein the central passage housing defines a second flow path generally parallel to, and in an opposite direction of, the first flow path.

2. The flow rate sensor of claim 1, wherein the drum housing and central passage housing are configured to direct a fluid along the second vortex portion of the first flow path such that the fluid drives rotation of the magnetic carrier.

3. The flow rate sensor system of claim 1, wherein the magnetic carrier comprises:
   a central ring oriented about the axis; and
   a plurality of fins oriented circumferentially along and extending radially outward from the central ring with respect to the axis.

4. The flow rate sensor system of claim 3, wherein the drum housing and central passage housing are configured to direct fluid in the first flow path to impinge partially circumferentially on the plurality of fins.

5. The flow rate sensor system of claim 3, wherein at least one of the plurality of fins contains the at least one magnet.

6. The flow rate sensor system of claim 3, wherein the magnetic carrier further comprises a plurality of webbing sections and each of the plurality of webbing sections is adjacent to one of the plurality of fins.

7. The flow rate sensor system of claim 3, wherein the plurality of fins are evenly spaced about the central ring.

8. The flow rate sensor of claim 1, wherein the drum housing comprises:
   an inner surface; and
   an interior wall which extends from the inner surface;
   wherein the interior wall extends circumferentially about a circumference of the inner surface and axially parallel to the axis such that the interior wall defines the second vortex portion of the first flow path.

9. A flow rate sensor system for an agricultural sprayer, the flow rate sensor system comprising:
   a drum housing and a central passage housing defining a first flow path comprising a first portion generally parallel to an axis and a second vortex portion around the axis;
   a Hall-effect sensor disposed facing the axis;
   a Hall-effect sensor window in a display housing and disposed between the Hall-effect sensor and the axis;

a magnetic carrier within the drum housing configured to rotate about the axis when fluid flows through the first flow path, the magnetic carrier comprising a central ring oriented about the axis and a plurality of fins oriented circumferentially along and extending radially outward from the central ring with respect to the axis; and at least one magnet positioned in the magnetic carrier, wherein— the plurality of fins comprises a plurality of primary fins and a plurality of secondary fins,     each of the plurality of primary fins has a primary length and a primary width,     each of the plurality of secondary fins has a secondary length and a secondary width,     the primary length is greater than the secondary length, and     the primary width is greater than the secondary width.

10. A method of operating a flow rate sensor system for an agricultural sprayer, the method comprising:

directing, with a drum housing and a central passage housing, a fluid along a first flow path with a first portion generally parallel to an axis and a second vortex portion around the axis;

directing, with the drum housing and the central passage housing, the fluid along a second flow path generally parallel to, and in an opposite direction of, the first flow path;

generating, with a source of a Hall-effect sensor, a current through a conductor of the Hall-effect sensor;

detecting, with a detector of the Hall-effect sensor, when at least one target passes a Hall-effect sensor window, wherein the at least one target comprises a magnet within the drum housing and in the vortex portion of the first flow path of the fluid;

generating, with a controller of the Hall-effect sensor, magnetic field data about the at least one target; and assessing, with the controller, a speed of the at least one target about the axis to calculate a flow rate of the fluid along the vortex portion of the first flow path.

11. The method of claim 10, further comprising rotating a magnetic carrier about a spray axis of the agricultural sprayer, wherein the at least one target is carried by the magnetic carrier.

12. The method of claim 11, wherein:

rotating a magnetic carrier about a spray axis of the agricultural sprayer comprises rotating a magnetic carrier comprising a plurality of fins;

generating, with the controller of the Hall-effect sensor, magnetic field data about the at least one target comprises generating magnetic field data about the plurality of fins; and assessing, with the controller, a speed of the at least one target about the axis comprises assessing a rotational speed of the magnetic carrier.

\* \* \* \* \*